(12) United States Patent
Yoshida

(10) Patent No.: US 7,883,997 B2
(45) Date of Patent: Feb. 8, 2011

(54) SOLID-PHASE SHEET GROWING SUBSTRATE AND METHOD OF MANUFACTURING SOLID-PHASE SHEET

(75) Inventor: Koji Yoshida, Minamikawachi-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 93 days.

(21) Appl. No.: 12/303,811

(22) PCT Filed: May 24, 2007

(86) PCT No.: PCT/JP2007/060600

§ 371 (c)(1),
(2), (4) Date: Dec. 8, 2008

(87) PCT Pub. No.: WO2007/145063

PCT Pub. Date: Dec. 21, 2007

(65) Prior Publication Data

US 2010/0159677 A1    Jun. 24, 2010

(30) Foreign Application Priority Data

Jun. 16, 2006    (JP)   ............................. 2006-167618

(51) Int. Cl.
*C30B 11/00*    (2006.01)
*H01L 21/20*    (2006.01)
*H01L 21/36*    (2006.01)
*C23C 16/24*    (2006.01)

(52) U.S. Cl. .................. 438/488; 438/490; 257/E21.09
(58) Field of Classification Search ................. 438/488, 438/489, 490; 257/E21.09
See application file for complete search history.

(56) References Cited

FOREIGN PATENT DOCUMENTS

| EP | 0 381 051 | 8/1990 |
|---|---|---|
| JP | 2-291117 | 11/1990 |
| JP | 2002-237465 | 8/2002 |
| JP | 2004-123433 | 4/2004 |
| JP | 2004-319621 | 11/2004 |
| WO | WO 2004/016836 | 2/2004 |

OTHER PUBLICATIONS

International Search Report for PCT/JP2007/060600, mailed Jul. 3, 2007.

*Primary Examiner*—Walter L Lindsay, Jr.
(74) *Attorney, Agent, or Firm*—Nixon & Vanderhye P.C.

(57) ABSTRACT

A solid-phase sheet growing substrate (100) includes a main surface (1) and a side surface (2A, 2B) surrounding the main surface (1). The main surface (1) is divided by a peripheral groove (10A) into a surrounding portion (12) located at the outer side of the peripheral groove (10A) and an inner portion (11) located at the inner side of the peripheral groove (10A), and a slit groove (2) separated from the peripheral groove (10A) is formed on the side surface (2A) of the surrounding portion (12).

9 Claims, 9 Drawing Sheets

SOLID-PHASE SHEET GROWING SUBSTRATE AND METHOD OF MANUFACTURING SOLID-PHASE SHEET

This application is the U.S. national phase of International Application No. PCT/JP2007/060600, filed 24 May 2007, which designated the U.S. and claims priority to Japan Application No. 2006-167618, filed 16 Jun. 2006, the entire contents of each of which are hereby incorporated by reference.

TECHNICAL FIELD

The present invention relates to a solid-phase sheet growing substrate and a method of manufacturing a solid-phase sheet, and particularly to a solid-phase sheet growing substrate for forming a solid-phase sheet using melt as a material and a method of manufacturing a solid-phase sheet.

BACKGROUND ART

In recent years, a method of immersing a solid-phase sheet growing substrate in the melt of a semiconductor material or metal material to form a solid-phase sheet on the surface of the solid-phase sheet growing substrate has been developed (for example, Patent Documents 1 and 2). According to this method, a plurality of solid-phase sheet growing substrates arranged at regular intervals are continuously immersed in the melt in a crucible. For example, in the case where a polycrystalline silicon sheet used for a solar cell as a solid-phase sheet is manufactured, in an inert atmosphere, a solid-phase sheet growing substrate is immersed in the melt in the crucible in which the high-purity silicon material having the dopant such as phosphorus or boron added thereto is heated and melted. This causes a polycrystalline silicon sheet to be formed on the surface of the solid-phase sheet growing substrate. The formed polycrystalline silicon sheet is peeled off from the solid-phase sheet growing substrate and cut into a desired size by a laser, a dicing saw or the like to provide a wafer for a solar cell.

FIG. 16 is a perspective view schematically showing the conventional solid-phase sheet growing substrate disclosed in Japanese Patent Laying-Open No. 2002-237465 (Patent Document 1). Referring to FIG. 16, a peripheral groove 10 is formed on the top surface of a solid-phase sheet growing substrate 100 in the figure, and a cut-out groove 170 is further formed on the right and left sides thereof in the figure. This configuration causes a surrounding portion 12 located at the outer side of peripheral groove 10 to be divided into two C-shaped portions.

FIG. 17 is a perspective view schematically showing the conventional substrate (solid-phase sheet growing substrate) disclosed in the pamphlet of International Publication No. 04/016836 (Patent Document 2), FIG. 18 is a cross-sectional view taken along the line XVIII-XVIII in FIG. 17 in the state where silicon is formed on the surface of the substrate (solid-phase sheet growing substrate).

Referring to FIG. 17, a trench structure F13 is formed on a substrate first surface 135A and a substrate second surface 136A. This trench structure F13 serves to separate the silicon grown on peripheral portions 135a and 136a from the portion of the plate-like silicon mainly used as a product. Since the surface tension between the silicon melt and a substrate C13 (solid-phase sheet growing substrate) is high, the silicon melt comes into contact with substrate first surface 135A and peripheral portion 135a but not with trench structure F13. Accordingly, as shown in FIG. 18, the plate-like silicon 131A crystallized and grown on the surface of substrate first surface 135A and the silicon crystallized and grown on the surface of peripheral portion 135a are separated with trench structure F13 interposed therebetween.

Furthermore, a substrate third surface 138A is formed on substrate C13 (solid-phase sheet growing substrate). Substrate first surface 135A, substrate second surface 136A and substrate third surface 138A constitute a three-surface structure, which causes the formed silicon to be engaged in substrate C13 (solid-phase sheet growing substrate).

Patent Document 1: Japanese Patent Laying-Open No. 2002-237465 (FIG. 7)

Patent Document 2: Pamphlet of International Publication No. 04/016836 (FIG. 13)

DISCLOSURE OF THE INVENTION

Problems to be Solved by the Invention

After reviewing solid-phase sheet growing substrate 100 having cut-out groove 170 as disclosed in Japanese Patent Laying-Open No. 2002-237465 described above, however, it has been found that the effects of the surface tension between the silicon melt and solid-phase sheet growing substrate 100 are decreased in a three-way portion 30 in FIG. 16, and thus, the silicon melt may enter into peripheral groove 10. The silicon melt entering into peripheral groove 10 solidifies to cause loss of the effects of peripheral groove 10. This may lead to burrs on the edge of the silicon sheet which is supposed to be a product, deterioration of the film thickness distribution, cracks in the silicon sheet, and the like. Consequently, the silicon sheet needs to be manufactured again, which causes problems including a decrease in production efficiency and an increase in product cost.

Furthermore, substrate C13 (solid-phase sheet growing substrate) as disclosed in the pamphlet of International Publication No. 04/016836 mentioned above is also reviewed. In the method of manufacturing a plate-like polycrystalline silicon using this substrate C13 (solid-phase sheet growing substrate), a portion in which a product surrounded by trench structure F13 is formed and peripheral portion 135a corresponding to a portion located at the outer side of trench structure F13 are immersed in the high purity silicon melt to form a plate-like polycrystalline silicon in the portion surrounded by trench structure F13. In this case, polycrystalline silicon is also formed in peripheral portion 135a. Furthermore, as shown in FIG. 18, also on the side surface in the figure, the silicon extends to a length equal to the depth to which substrate C13 (solid-phase sheet growing substrate) is immersed in the melt.

The polycrystalline silicon formed in this peripheral portion 135a starts heat shrinkage at the same time when substrate C13 (solid-phase sheet growing substrate) is removed from the melt. The polycrystalline silicon formed in peripheral portion 135a is integrated with the polycrystalline silicon formed in the side surface portion of substrate C13 (solid-phase sheet growing substrate), which prevents the deformation resulting from the heat shrinkage on the side surface of substrate C13 (solid-phase sheet growing substrate). A stress is applied to the polycrystalline silicon formed in peripheral portion 135a in which deformation resulting from the heat shrinkage is prevented. This stress reaches a magnitude that causes breakage of the silicon, and thus, the polycrystalline silicon will be detached from peripheral portion 135a of substrate C13 (solid-phase sheet growing substrate). This detached polycrystalline silicon falls into the melt in the crucible or falls outside the crucible.

The polycrystalline silicon that has fallen into the silicon melt will re-melt after a sufficient period of time. However, the fallen polycrystalline silicon takes a long period of time to re-melt, which causes problems including a decrease in production efficiency and an increase in product cost.

Furthermore, if the next substrate C13 (solid-phase sheet growing substrate) is immersed in the state where re-melting is insufficient, the polycrystalline silicon suspended in the melt is sandwiched between substrate C13 (solid-phase sheet growing substrate) and the crucible, which causes a problem that substrate C13 (solid-phase sheet growing substrate) or an immersion mechanism for immersing substrate C13 (solid-phase sheet growing substrate) in the melt may be damaged.

The present invention has been made in light of the above-described problems and an object of the present invention is to provide a method of manufacturing a solid-phase sheet by which production efficiency is increased and a manufacturing apparatus is less likely to be damaged, and a solid-phase sheet growing substrate used therefor.

Means for Solving the Problems

The solid-phase sheet growing substrate of the present invention includes a main surface and a side surface surrounding the main surface. The main surface is divided by a peripheral groove into a surrounding portion located at an outer side of the peripheral groove and an inner portion located at an inner side of the peripheral groove, a plurality of slit grooves separated from the peripheral groove are formed on the side surface of the surrounding portion and the side surface located between the slit grooves adjacent to each other among the plurality of the slit grooves is a flat surface.

According to the solid-phase sheet growing substrate of the present invention, the slit groove is formed on the side surface of the solid-phase sheet growing substrate. This causes a slit portion to be formed also in a detached portion which falls into the melt in the crucible. This detached portion melts preferentially from the slit portion in the melt and is immediately fragmented. Consequently, the possibility that the detached portion may be sandwiched between the solid-phase sheet growing substrate and the crucible can be reduced, which allows prevention of breakage of the manufacturing apparatus.

Furthermore, as compared to the case of a massive object, the fragmented detached portion completely melts immediately, which causes the time required for re-melting to be shortened. Accordingly, the time interval can be shortened at which a plurality of solid-phase sheet growing substrates are immersed in the melt in the crucible. Therefore, the production efficiency of the solid-phase sheet can be improved.

According to the solid-phase sheet growing substrate of the present invention, the slit groove is separated from the peripheral groove, and thus, there is no portion joining the slit groove and the peripheral groove in which the surface tension of the melt is considered to be insufficient. Therefore, it is possible to prevent the melt from entering into the slit groove and the peripheral groove due to insufficient surface tension.

In the solid-phase sheet growing substrate described above, preferably, the peripheral groove is provided such that a solid-phase sheet formed on the surrounding portion and a solid-phase sheet formed on the inner portion are formed separately along the peripheral groove. Furthermore, the slit groove has a depth of not less than 1 mm and not more than 5 mm.

In the case where the solid-phase sheet growing substrate is used for manufacturing the solid-phase sheet of a semiconductor, the slit groove having a width of not less than 1 mm serves to prevent the solid-phase sheet from growing such that it bridges the slit groove. Furthermore, the slit groove having a width of not more than 5 mm serves to prevent the material melt from entering into and filling in the slit groove.

In the solid-phase sheet growing substrate described above, preferably, the slit groove has a depth of not less than 1 mm.

Accordingly, in the case where the solid-phase sheet growing substrate is used for manufacturing the solid-phase sheet of a semiconductor, the melt is prevented from contacting the solid-phase sheet growing substrate within the slit groove and growing therein.

The solid-phase sheet growing substrate described above preferably includes a plurality of slit grooves in which a spacing between the adjacent slit grooves is not less than 1 mm.

Accordingly, in the case where solid-phase sheet growing substrate 100 is used for manufacturing the solid-phase sheet of a semiconductor, solid-phase sheet growing substrate 100 can be prevented from being damaged.

In the method of manufacturing a solid-phase sheet of the present invention, the above-described solid-phase sheet growing substrate is immersed in a melt to grow a solid-phase sheet on the main surface of the solid-phase sheet growing substrate using the melt as a material.

The method of manufacturing the solid-phase sheet of the present invention allows the solid-phase sheet to be manufactured while exhibiting the effects of the solid-phase sheet growing substrate of the present invention described above.

In the method of manufacturing the solid-phase sheet described above, preferably, when the solid-phase sheet growing substrate is immersed in the melt, a portion of the slit groove is immersed and a portion of the slit groove is not immersed.

Accordingly, a slit portion having a length greater than the depth to which the solid-phase sheet growing substrate is immersed can be formed on the above-described detached portion. This provides the detached portion with a slit having a sufficient length.

In the method of manufacturing the solid-phase sheet described above, preferably, the solid-phase sheet growing substrate includes a plurality of slit grooves, a crucible contains the melt, and the solid-phase sheet growing substrate is immersed at a distance from an inner wall of the crucible longer than a spacing between the slit grooves.

Consequently, the detached portion obtained by the slit portion preferentially melting and fragmenting in the crucible is prevented from being sandwiched between the solid-phase sheet growing substrate and the crucible.

In the method of manufacturing the solid-phase sheet described above, preferably, the solid-phase sheet to be manufactured is a semiconductor.

Accordingly, a semiconductor solid-phase sheet can be manufactured while securing high production efficiency and preventing breakage of the manufacturing apparatus.

Effects of the Invention

As described above, according to the present invention, a slit groove separated from the peripheral groove is formed on the side surface of the surrounding portion of the solid-phase sheet growing substrate. Therefore, the production efficiency of the solid-phase sheet can be improved and the manufacturing apparatus of the solid-phase sheet can be prevented from being damaged.

DESCRIPTION OF THE REFERENCE SIGNS

1 main surface, 2A, 2B side surface, 10, 10A, 10B peripheral groove, 11 inner portion, 12 surrounding portion, 20 slit groove, 21 slit portion, 29 engagement recess, 30 three-way portion, 100 solid-phase sheet growing substrate, 135a, 136a peripheral portion, 135A substrate first surface, 136A substrate second surface, 138A substrate third surface, 170 cutout groove, 200 solid-phase sheet, 201 detached portion, 501 crucible, 502 chamber, 503 melting heater, 504 immersion mechanism, 506 melt, 508 substrate transporting conveyor, 509 apparatus sub-chamber, 510 gate valve, 511 apparatus main chamber, C13 substrate.

BEST MODES FOR CARRYING OUT THE INVENTION

The embodiments of the present invention will be hereinafter described with reference to the accompanying drawings.

The configuration of the solid-phase sheet growing substrate of an embodiment of the present invention will be first described with reference to the accompanying drawings.

Figure 1:
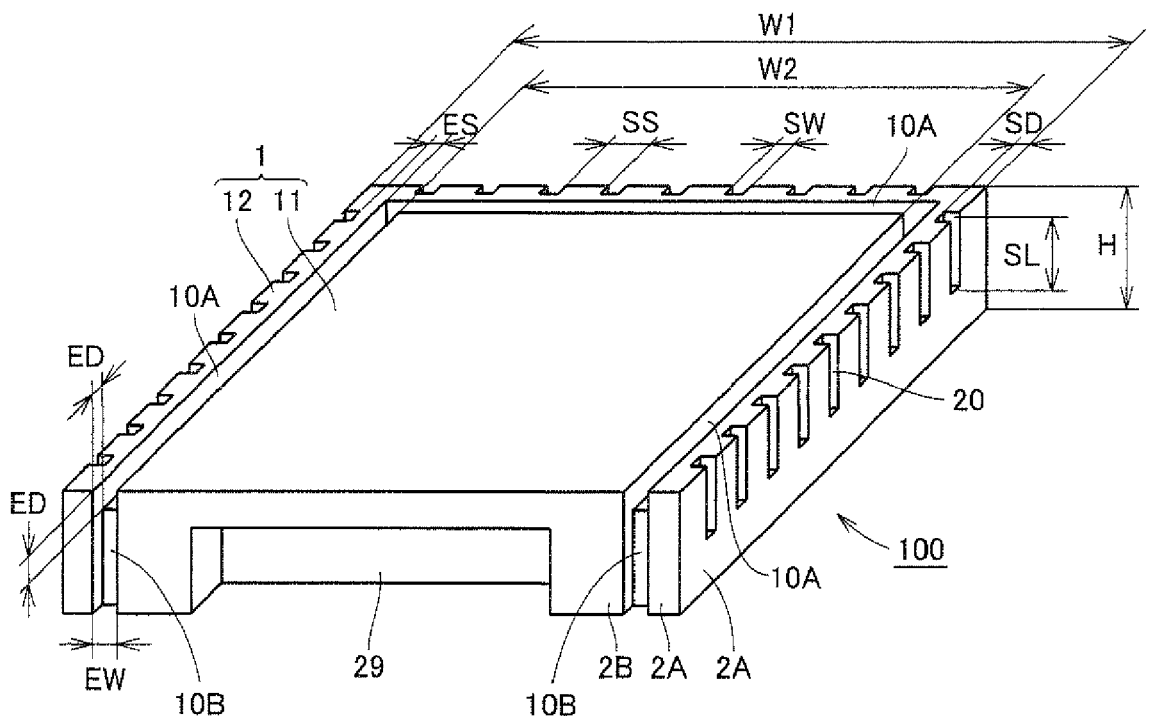
FIG. 1 is a perspective view schematically showing a configuration of a solid-phase sheet growing substrate in an embodiment of the present invention.

FIG. 1 is a perspective view schematically showing a configuration of a solid-phase sheet growing substrate in an embodiment of the present invention. Referring to FIG. 1, a peripheral groove 10A is formed in the vicinity of the edge portion of a main surface 1 of a solid-phase sheet growing substrate 100. This peripheral groove 10A divides main surface 1 into an inner portion 11 and a surrounding portion 12. Inner portion 11 is located at the inner side of peripheral groove 10A, provides a region in which a solid-phase sheet to be used as a product is formed, and occupies most of the area of main surface 1. Surrounding portion 12 is located at the outer side of peripheral groove 10A so as to, for example, surround three sides of inner portion 11. Main surface 1 is surrounded by side surfaces 2A and 2B. In this case, side surface 2A corresponds to the side surface of surrounding portion 12 and side surface 2B corresponds to the side surface of inner portion 11.

A slit groove 20 is formed on side surface 2A of surrounding portion 12 of main surface 1. This slit groove 20 is formed separated from peripheral groove 10A. In other words, peripheral groove 10A and slit groove 20 are separated by a spacing ES and do not connect with each other.

A peripheral groove 10B is formed in the boundary portion between side surface 2A of surrounding portion 12 and side surface 2B of inner portion 11. Peripheral groove 10A and peripheral groove 10B are formed continuously. On side surface 2B of the inner portion, an engagement recess 29 is formed which corresponds to a recess formed in the region separated from inner portion 11.

Slit groove 20 has a width SW of preferably not less than 1 mm and not more than 5 mm. Slit groove 20 has a depth SD of preferably not less than 1 mm. Furthermore, there are preferably a plurality of slit grooves 20 in which it is preferable that a spacing SS between adjacent slit grooves 20 is not less than 1 mm. It is preferable that slit groove 20 has a length SL greater than or equal to the immersion depth to which this solid-phase sheet growing substrate 100 is immersed in the melt to be used as raw material of a solid-phase sheet.

Peripheral grooves 10A and 10B each have a width EW of preferably not less than 1 mm and not more than 5 mm. Furthermore, peripheral grooves 10A and 10B each have a depth ED of preferably not less than 1 mm.

A manufacturing apparatus of the solid-phase sheet provided with the solid-phase sheet growing substrate according to an embodiment of the present invention will then be described with reference to the figures.

Figure 2:
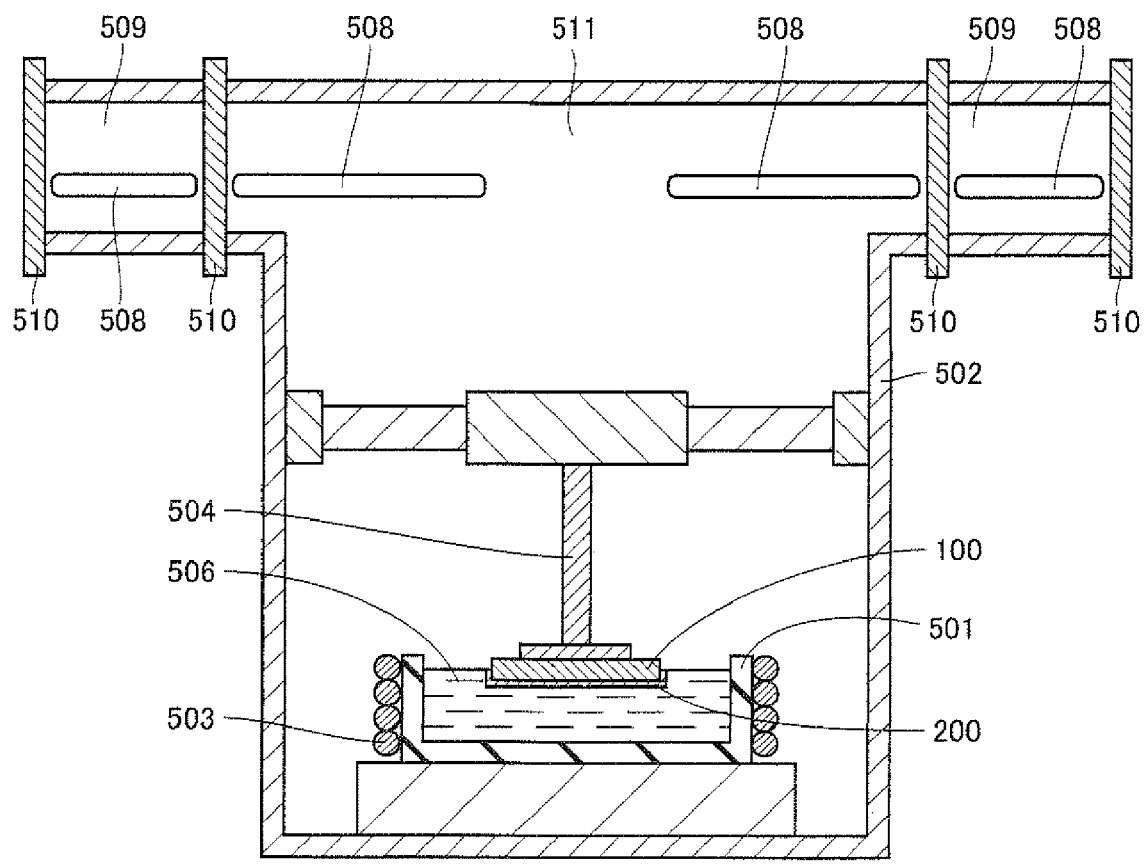
FIG. 2 is a cross-sectional view schematically showing a configuration of a manufacturing apparatus of a solid-phase sheet provided with the solid-phase sheet growing substrate in the embodiment of the present invention.

FIG. 2 is a cross-sectional view schematically showing the configuration of the manufacturing apparatus of a solid-phase sheet in the embodiment of the present invention. Referring to FIG. 2, a chamber 502 capable of controlling the internal atmosphere is partitioned by a gate valve 510 into an apparatus main chamber 511 and an apparatus sub-chamber 509. Furthermore, apparatus sub-chamber 509 is connected to the outside via another gate valve 510. Thus, when gate valve 510 is opened, solid-phase sheet growing substrate 100 can be transported into and out of chamber 502. A substrate transporting conveyor 508 is disposed between apparatus sub-chamber 509 and apparatus main chamber 511 to thereby allow transportation of solid-phase sheet growing substrate 100.

An immersion mechanism 504 is provided to and from which solid-phase sheet growing substrate 100 can be attached and detached in the end portion on the apparatus main chamber 511 side of substrate transporting conveyor 508. This immersion mechanism 504 can be moved in the state where solid-phase sheet growing substrate 100 is suspended therefrom. A crucible 501 is disposed within the range in which the mechanism can be moved. Crucible 501 is provided with a melting heater 503 for heating the contents of crucible 501, allowing the material to be heated and melted into a melt 506. Main surface 1 of solid-phase sheet growing substrate 100 is immersed in this melt 506 to cause a solid-phase sheet 200 to grow.

The process of manufacturing the solid-phase sheet according to an embodiment of the present invention will then be described with reference to FIGS. 3-12.

Figure 3:
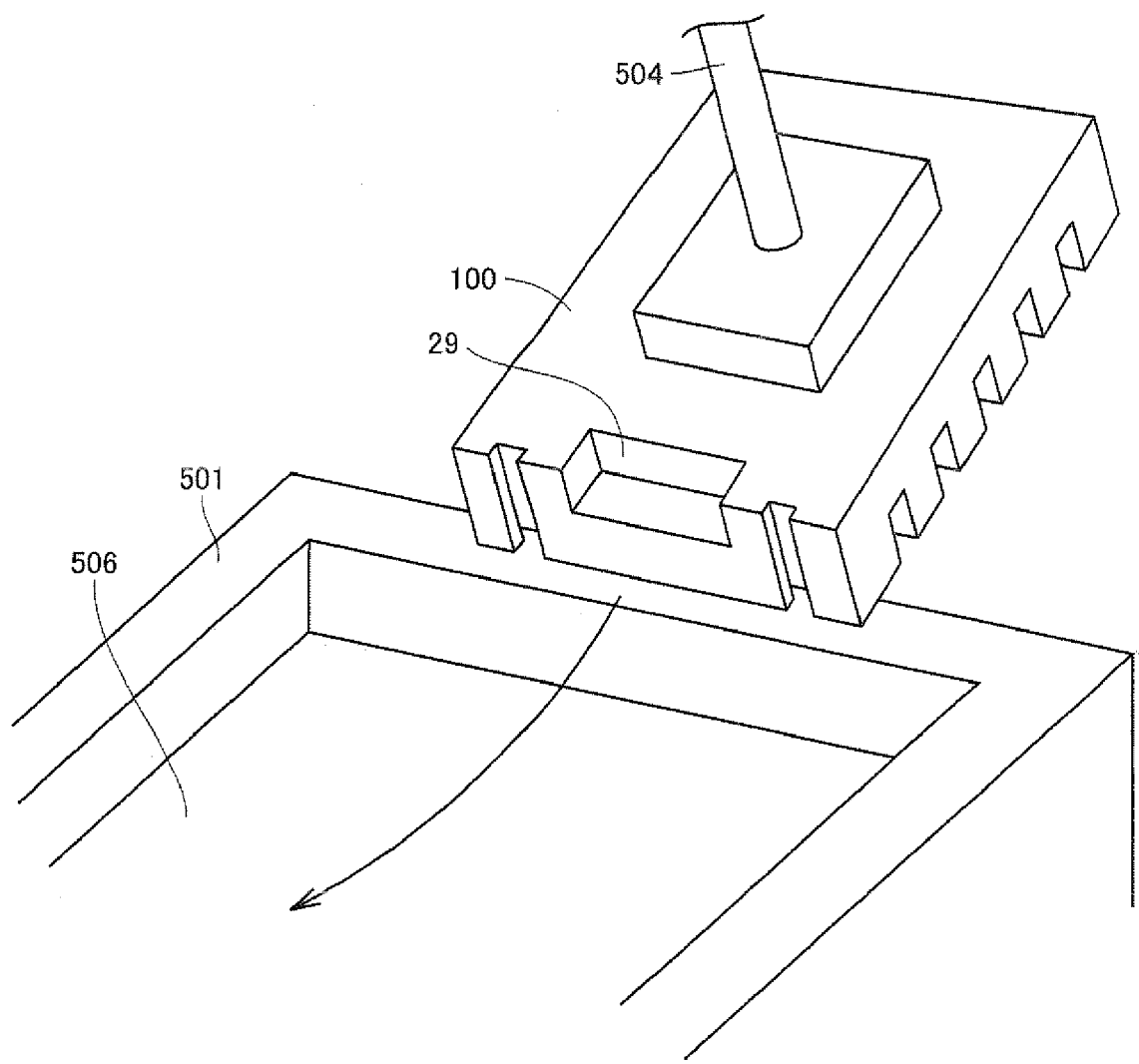
FIG. 3 is a perspective view schematically showing the manner in which the solid-phase sheet growing substrate moves toward the melt in the embodiment of the present invention.

FIG. 3 is a perspective view schematically showing the manner in which the solid-phase sheet growing substrate moves toward the melt in the embodiment of the present invention. Referring to FIG. 3, solid-phase sheet growing substrate 100 is moved in the direction of an arrow in the figure toward melt 506 in crucible 501 in the state where it is suspended from immersion mechanism 504. Solid-phase sheet growing substrate 100 is attached to immersion mechanism 504 in such a manner that main surface 1 corresponds to the underside (surface which is not shown) in the figure and engagement recess 29 faces in the direction of travel.

Figure 4:
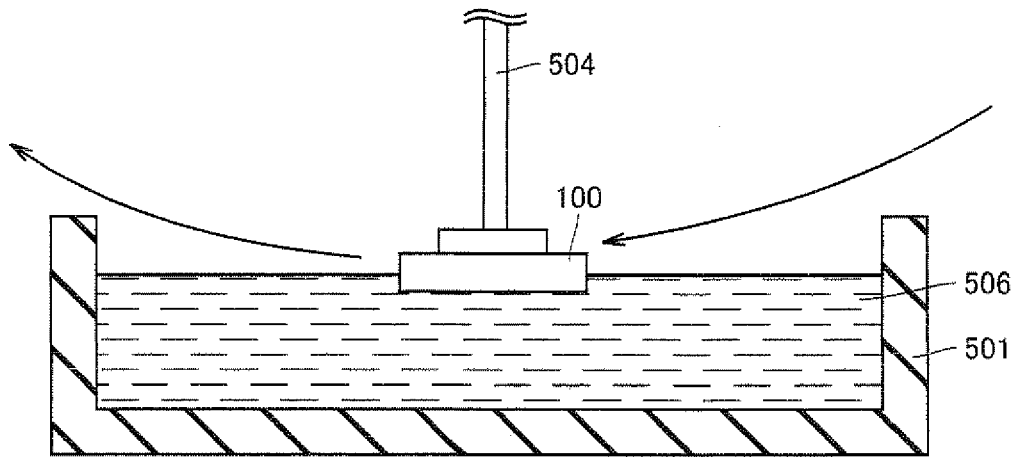
FIG. 4 is a cross-sectional view schematically showing the path along which the solid-phase sheet growing substrate moves within a crucible in the embodiment of the present invention.

FIG. 4 is a cross-sectional view schematically showing the path along which the solid-phase sheet growing substrate moves within the crucible in the embodiment of the present invention. Referring to FIG. 4, immersion mechanism 504 and solid-phase sheet growing substrate 100 are moved within crucible 501 as indicated by the arrow in the figure. Crucible 501 contains heated and molten melt 506 of the solid-phase sheet material. As solid-phase sheet growing substrate 100 is moved, the main surface of solid-phase sheet growing substrate 100 is immersed in melt 506 and then moved out of melt 506.

Figure 5:
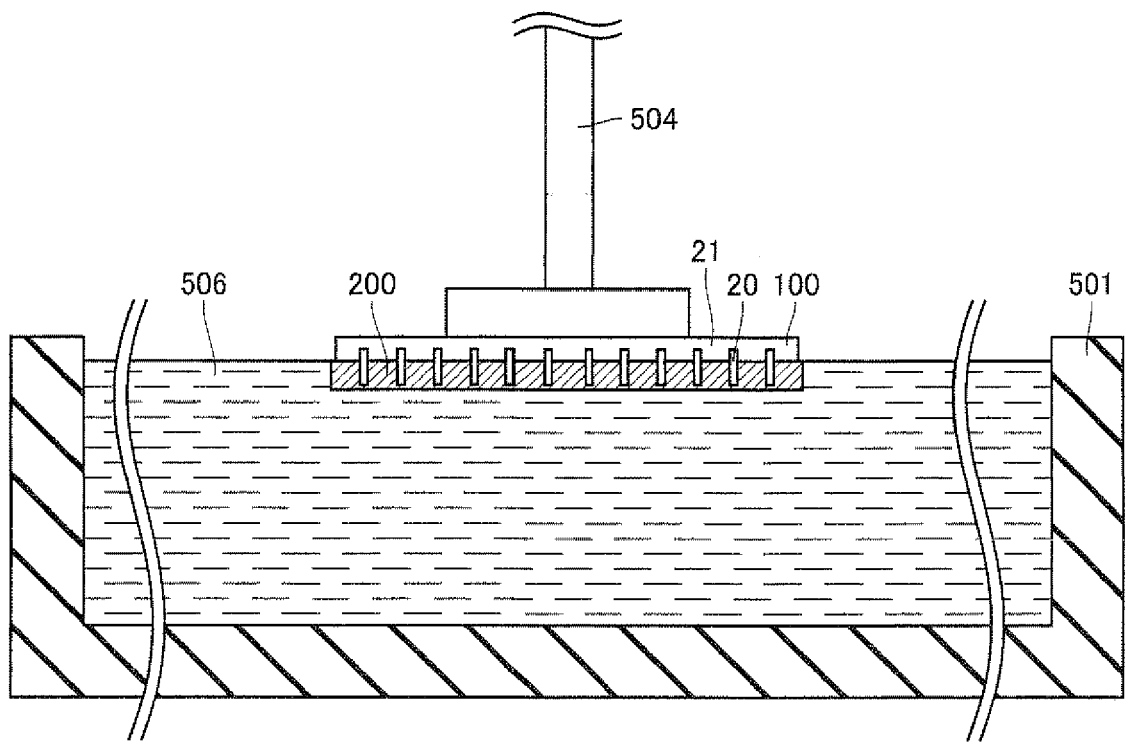
FIG. 5 is a cross-sectional view schematically showing the manner in which the solid-phase sheet grows on the side surface of the solid-phase sheet growing substrate at the time when the solid-phase sheet growing substrate is immersed most deeply in the melt in the embodiment of the present invention.

FIG. 5 is a cross-sectional view schematically showing the manner in which the solid-phase sheet grows on the side surface of the solid-phase sheet growing substrate at the time when the solid-phase sheet growing substrate is immersed most deeply in the melt in the embodiment of the present invention. Referring to FIG. 5, even in the state where solid-phase sheet growing substrate 100 is most deeply immersed, the level of the surface of melt 506 is at some midpoint of slit groove 20. In other words, a portion of slit groove 20 is immersed in melt 506 and a portion thereof is not immersed in melt 506.

While solid-phase sheet 200 grows in the portion in which solid-phase sheet growing substrate 100 is immersed, solid-phase sheet 200 does not grow in the portion corresponding to slit groove 20 due to the surface tension acting on melt 506.

Figure 6:
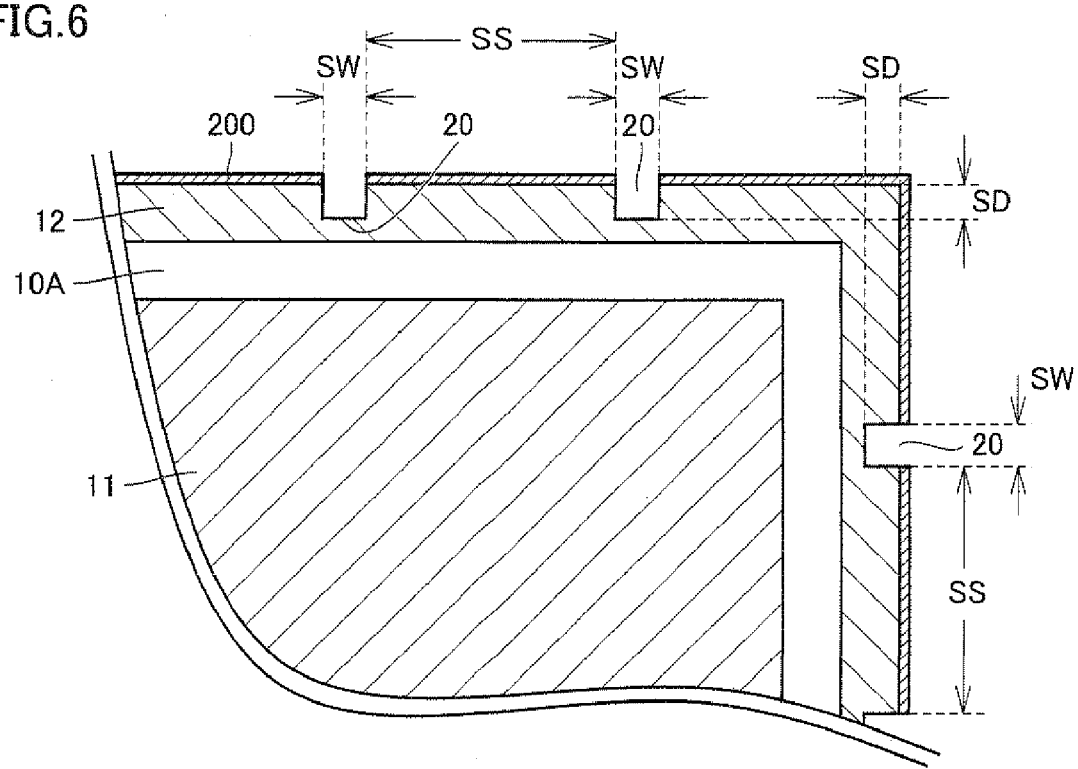
FIG. 6 is a cross-sectional view schematically showing the manner in which the solid-phase sheet grows on the side surface of the solid-phase sheet growing substrate in the embodiment of the present invention.

FIG. 6 is a cross-sectional view schematically showing the manner in which the solid-phase sheet grows on the side surface of the solid-phase sheet growing substrate in the embodiment of the present invention. Referring to FIG. 6, slit groove 20 of the embodiment of the present invention is formed separated from peripheral groove 10A.

If slit groove 20 has appropriate width SW and depth SD, the growth of solid-phase sheet 200 in the portion corresponding to slit groove 20 is suppressed with more reliability. Consequently, solid-phase sheet 200 is formed to have a portion separated by slit groove 20.

If width SW of slit groove 20 is too large, the surface tension between melt 506 and solid-phase sheet growing substrate 100 is insufficient. As a result, melt 506 enters into slit groove 20 to thereby form solid-phase sheet 200 so as to fill in slit groove 20. For example, in the case where melt 506 of a semiconductor material is used, it is preferable that slit groove 20 has width SW of not more than 5 mm in order to cause the surface tension of melt 506 to sufficiently act.

If width SW of slit groove 20 is too narrow, the viscosity of melt 506 causes solid-phase sheet 200 to grow in such a manner that it spans slit groove 20, which creates a portion in solid-phase sheet 200 which is not separated by slit groove 20. For example, in the case where melt 506 of a semiconductor material is used, this phenomenon can be prevented by providing slit groove 20 having width SW of not less than 1 mm.

For the reasons described above, it is preferable that slit groove 20 has width SW of not less than 1 mm and not more than 5 mm. Furthermore, slit groove 20 is configured to have width SW of about 3 mm which is in the vicinity of the median value of this dimensional range, with the result that the growth of the solid phase in a portion corresponding to slit groove 20 can be suppressed with more stability.

If depth SD of slit groove 20 is too shallow, melt 506 entering into slit groove 20 comes into contact with the inner wall of slit groove 20 to cause formation of a solid phase. For example, in the case where melt 506 of a semiconductor material is used, this phenomenon can be prevented by providing slit groove 20 having depth SD of not less than 1 mm.

Spacing SS between slit grooves 20 affects the thermal conductivity between solid-phase sheet growing substrate 100 and melt 506. If spacing SS between slit grooves 20 is too small, the area in which slit groove 20 is not formed on side surface 2A is decreased. This reduces the area in which side surface 2A and melt 506 are in contact with each other.

Forming a solid phase from melt 506 requires thermal conduction caused by sufficient contact between solid-phase sheet growing substrate 100 and melt 506. It is considered that, in the case where the thermal conduction is insufficient and thus a solid phase is not formed in the surrounding portion of slit groove 20, the surface tension for preventing melt 506 from entering into slit groove 20 does not act. Consequently, a solid phase is formed within slit groove 20. When a solid phase is thus formed within slit groove 20, the solid phase has a volume greater than that of melt 506 due to its solidification and expansion. This causes a force to be exerted to expand slit groove 20, which may result in breakage of surrounding portion 12 of solid-phase sheet growing substrate 100.

It is experimentally confirmed that this breakage frequently occurs in the case where spacing SS between slit grooves 20 is less than 1 mm. Therefore, it is preferable that spacing SS between slit grooves 20 is not less than 1 mm.

It is preferable that the desired upper limit value for spacing SS between slit grooves 20 is less than or equal to a spacing between solid-phase sheet growing substrate 100 and the inner wall of crucible 501 at the time when solid-phase sheet growing substrate 100 is immersed in melt 506, which will be hereinafter described in detail.

Figure 7:
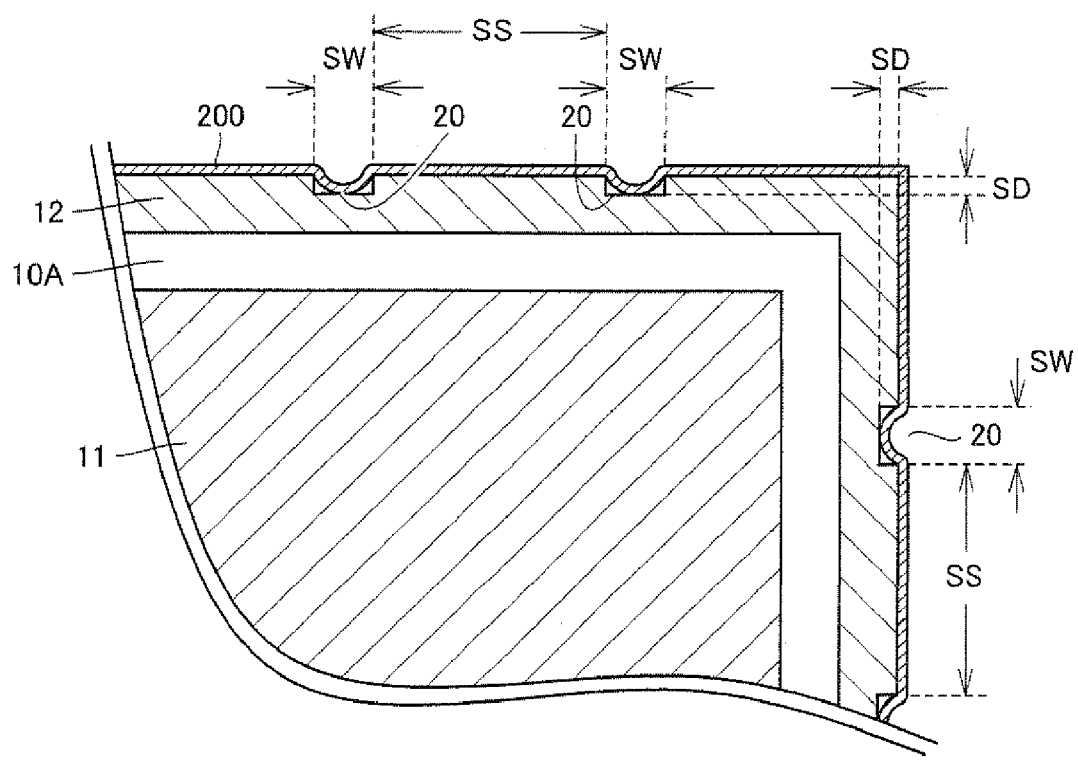
FIG. 7 is a cross-sectional view schematically showing the manner in which the solid-phase sheet grows on the side surface of the solid-phase sheet growing substrate in a comparative example of the present invention.

FIG. 7 is a cross-sectional view schematically showing the manner in which the solid-phase sheet grows on the side surface of the solid-phase sheet growing substrate in a comparative example of the present invention. Referring to FIG. 7, this comparative example shows an example of at least one of the cases where width SW of slit groove 20 is too large and depth SD thereof is too shallow. When width SW of slit groove 20 is too large, the surface tension between melt 506 and solid-phase sheet growing substrate 100 in slit groove 20 is insufficient, and thus, melt 506 enters into slit groove 20 to thereby form a solid phase. When depth SD of slit groove 20 is too shallow, melt 506 entering into slit groove 20 comes into contact with the inner wall of slit groove 20 to thereby form a solid phase.

Figure 8:
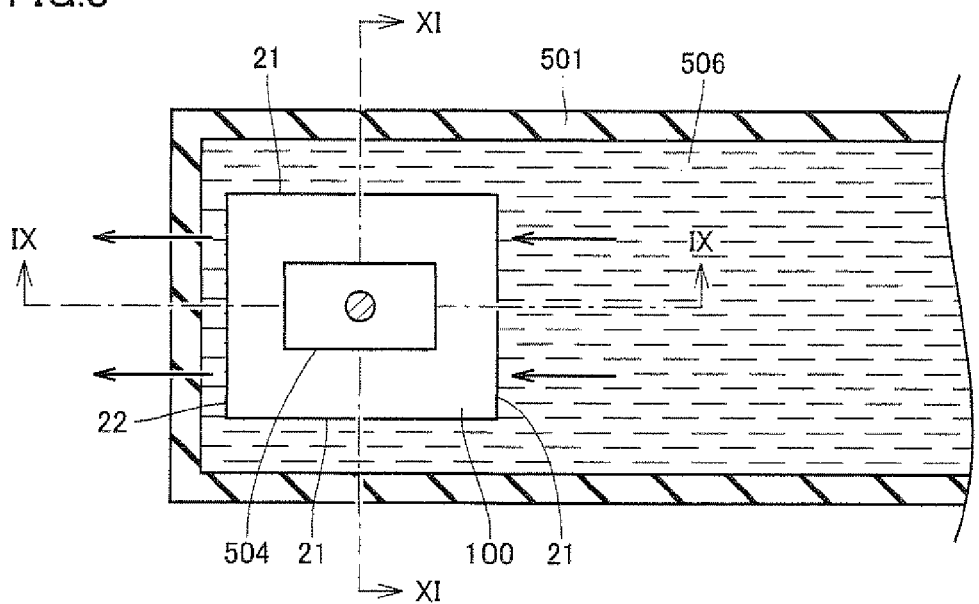
FIG. 8 is a top view schematically showing the state immediately after the solid-phase sheet growing substrate is moved out of the melt in the embodiment of the present invention.

FIG. 8 is a top view schematically showing the state immediately after the solid-phase sheet growing substrate is moved out of the melt in the embodiment of the present invention. Referring to FIG. 8, the arrow in the figure indicates the direction in which solid-phase sheet growing substrate 100 and immersion mechanism 504 move.

Figure 9:
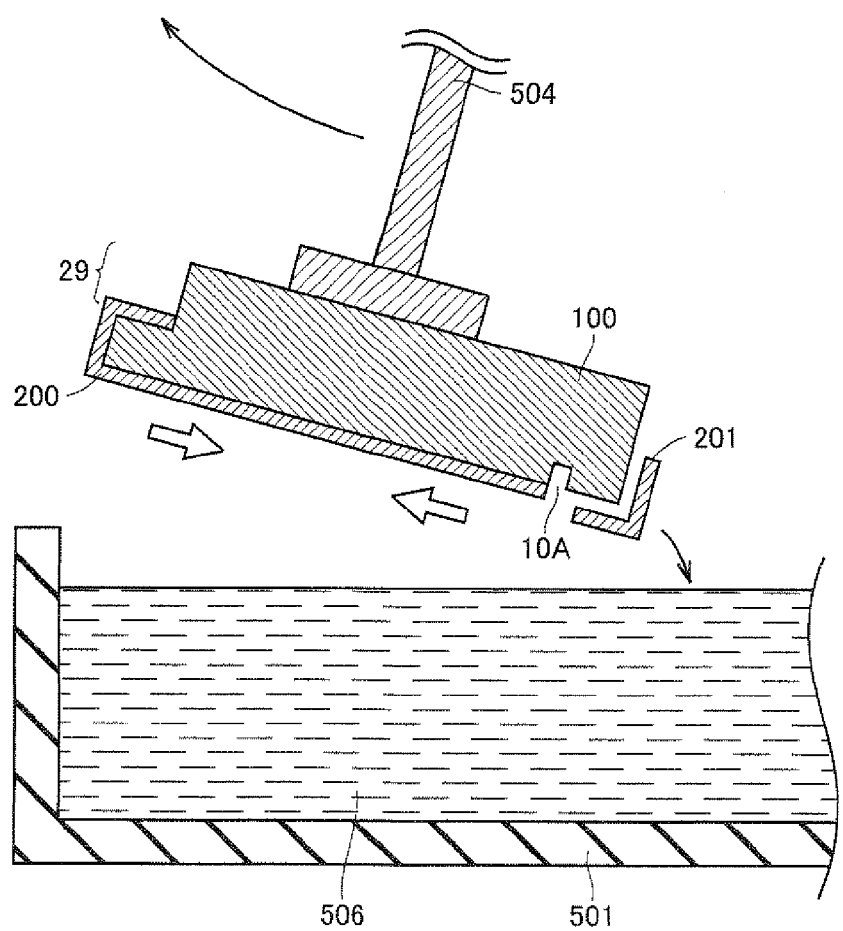
FIG. 9 is a cross-sectional view schematically showing the state immediately after the solid-phase sheet growing substrate is moved out of the melt in the embodiment of the present invention.

FIG. 9 is a cross-sectional view taken along the line IX-IX in FIG. 8 and schematically showing the state immediately after the solid-phase sheet growing substrate is moved out of the melt in the embodiment of the present invention. Referring to FIG. 9, solid-phase sheet growing substrate 100 is moved out of melt 506 as immersion mechanism 504 moves obliquely upward (solid arrow directed to the upper left in the figure). Solid-phase sheet 200 formed on the surface of solid-phase sheet growing substrate 100 is then rapidly cooled by the ambient atmosphere. In the main portion of solid-phase sheet 200, while heat shrinkage occurs as indicated by the hollow arrow in the figure, the thermal stress is relieved since the end portion on the right side thereof is not restrained. Furthermore, solid-phase sheet 200 is engaged in solid-phase sheet growing substrate 100 by engagement recess 29 and therefore prevented from falling due to gravity. Since the solid-phase objects formed on surrounding portion 12 of solid-phase sheet growing substrate 100 and on side surface 2A of surrounding portion 12 are not provided with such an engagement portion, they fall as a detached portion 201 into melt 506 within crucible 501 during heat shrinkage. This detached portion 201 will be described below in detail.

Figure 10:
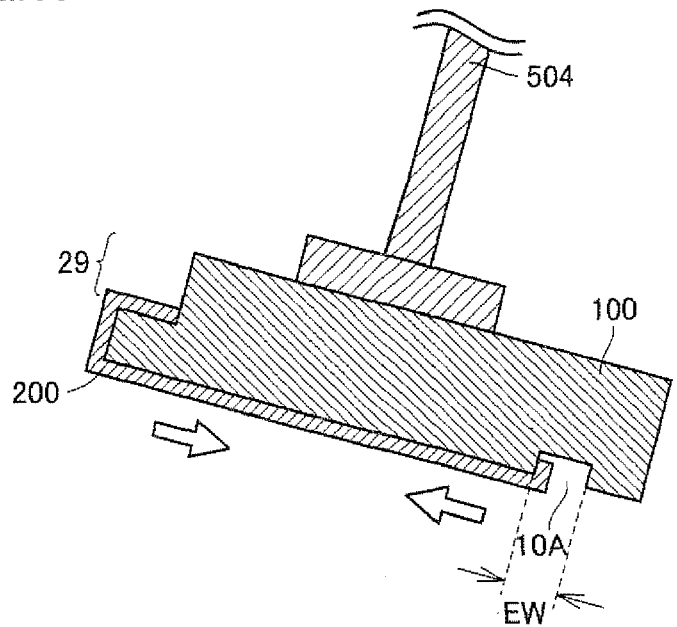
FIG. 10 is a cross-sectional view schematically showing the state immediately after the solid-phase sheet growing substrate is moved out of the melt in a comparative example of the present invention.

FIG. 10 is a cross-sectional view schematically showing the state immediately after the solid-phase sheet growing substrate is moved out of the melt in a comparative example of the present invention, in which the position of its cross section is the same as in FIG. 9. Referring to FIG. 10, when width EW of peripheral groove 10A is too large, the surface tension between melt 506 and solid-phase sheet growing substrate 100 is insufficient. Consequently, melt 506 enters into peripheral groove 10A to thereby form a solid phase so as to fill in peripheral groove 10A. In contrast to the embodiment of the present invention shown in FIG. 9, this brings about a state in which solid-phase sheet 200 has one end restrained by engagement recess 29 and the other end restrained by peripheral groove 10A. When the thermal stress is applied as indicated by the hollow arrow in FIG. 10 in the state where both ends are restrained in this way, the thermal stress applied during rapid cooling is not relieved, which causes breakage of solid-phase sheet 200 formed on inner portion 11 of solid-phase sheet growing substrate 100.

Figure 11:
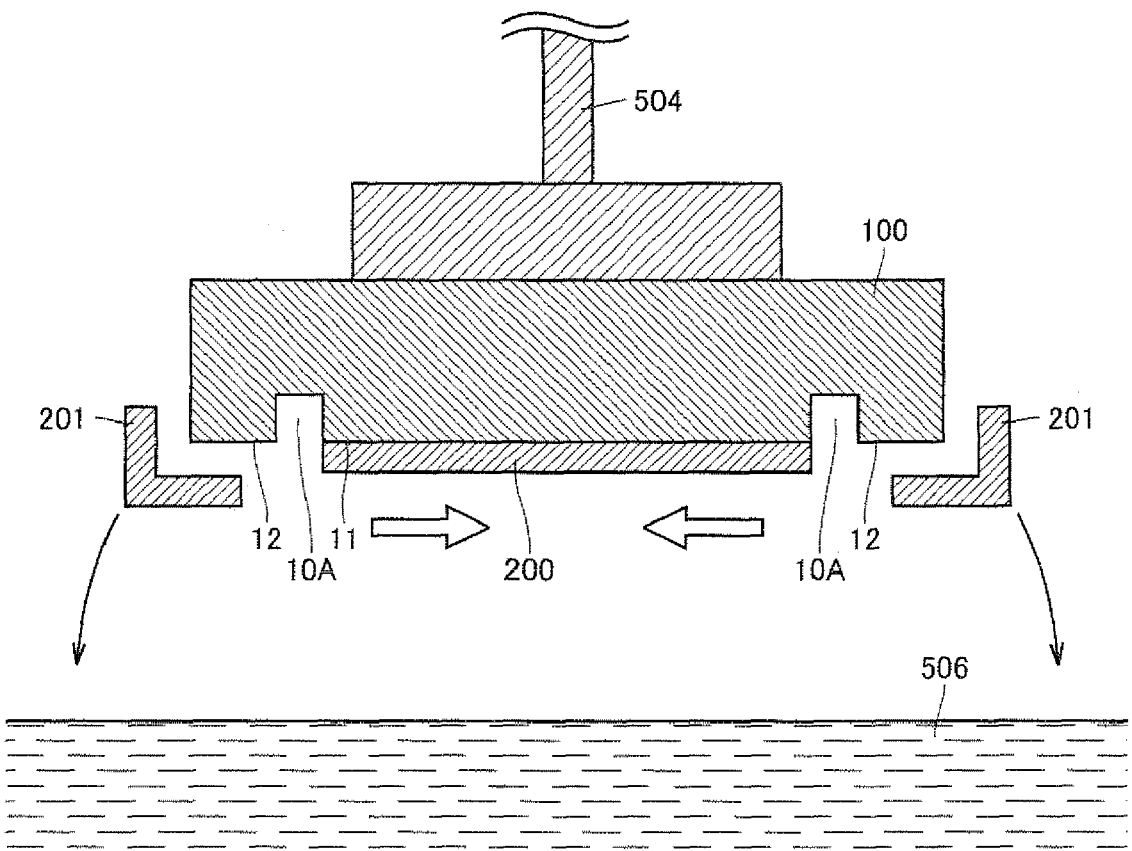
FIG. 11 is a cross-sectional view schematically showing the state immediately after the solid-phase sheet growing substrate is moved out of the melt in an embodiment of the present invention.

FIG. 11 is a cross-sectional view taken along the line XI-XI in FIG. 8 and schematically showing the state immediately after the solid-phase sheet growing substrate is moved out of the melt in an embodiment of the present invention. Referring to FIG. 11, solid-phase sheet 200 formed on the surface of solid-phase sheet growing substrate 100 is rapidly cooled by the ambient atmosphere. In the main portion of solid-phase sheet 200, while heat shrinkage occurs as indicated by the hollow arrow in the figure and the thermal stress is relieved, solid-phase sheet 200 is engaged by engagement recess 29 and therefore prevented from falling, as described in FIG. 9. Since the solid-phase object formed on surrounding portion 12 located at the outer side of peripheral groove 10A is not engaged in this way, it falls into melt 506 as detached portion 201 during heat shrinkage. This detached portion 201 will be described below in detail.

Figure 12:
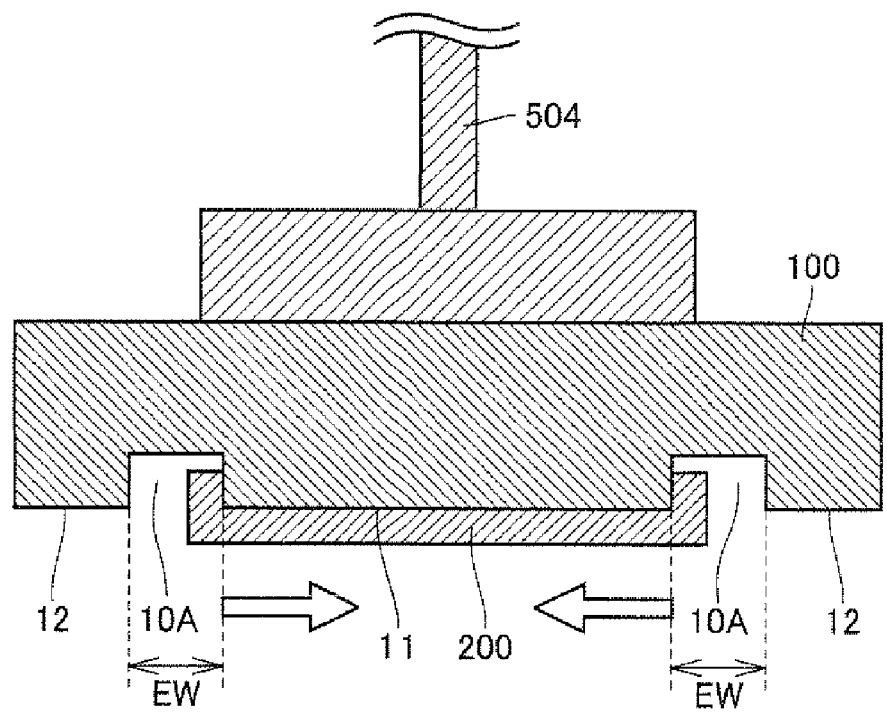
FIG. 12 is a cross-sectional view schematically showing the state immediately after the solid-phase sheet growing substrate is moved out of the melt in the comparative example of the present invention.

FIG. 12 is a cross-sectional view schematically showing the state immediately after the solid-phase sheet growing substrate is moved out of the melt in the comparative example of the present invention, in which the position of its cross section is the same as in FIG. 11. Referring to FIG. 12, when width EW of peripheral groove 10A is too large, the surface tension between melt 506 and solid-phase sheet growing substrate 100 is insufficient. Consequently, melt 506 enters into peripheral groove 10A to thereby form a solid phase so as to fill in peripheral groove 10A. In contrast to the embodiment of the present invention shown in FIG. 11, this brings about a state in which both ends of solid-phase sheet 200 are restrained by peripheral groove 10A. When the thermal stress is applied as indicated by the hollow arrow shown in FIG. 12 in the state where both ends are restrained in this way, the thermal stress applied during rapid cooling is not relieved, which causes breakage of solid-phase sheet 200 formed on inner portion 11 of solid-phase sheet growing substrate 100.

Solid-phase sheet growing substrate 100 pulled up from melt 506 by immersion mechanism 504 as shown in FIG. 9 is transported to apparatus sub-chamber 509 by substrate transporting conveyor 508 as described in FIG. 2. In this case, gate valve 510 between apparatus sub-chamber 509 and apparatus main chamber 511 is in the opened state. After this gate valve 510 is closed, the atmosphere within apparatus sub-chamber 509 is exchanged as required. Gate valve 510 separating apparatus sub-chamber 509 from the outside is then opened and solid-phase sheet growing substrate 100 is removed to the outside. Solid-phase sheet 200 formed on the surface of inner portion 11 of the removed solid-phase sheet growing substrate 100 is peeled of and cut as appropriate to be used as a product.

Figure 13:
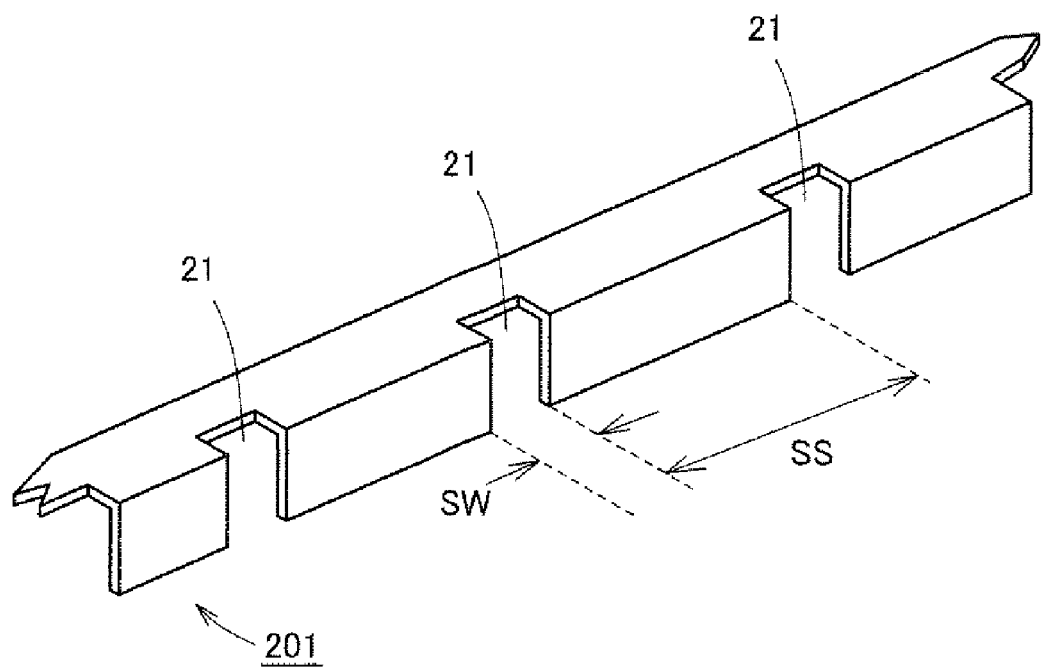
FIG. 13 is a perspective view schematically showing a detached portion in the embodiment of the present invention.

Detached portion 201 in the manufacturing process described above will then be described in detail with reference to FIG. 13. FIG. 13 is a perspective view schematically showing a detached portion in the embodiment of the present invention. Referring to FIG. 13, a slit portion 21 is formed also in a portion in the detached solid-phase sheet 200 corresponding to the position where slit groove 20 of solid-phase sheet growing substrate 100 is formed. Furthermore, slit portion 21 has a slit width approximately equal to width SW of slit groove 20. This detached portion 201 is weak in strength due to its reduced width in slit portion 21. Accordingly, when detached portion 201 falls from surrounding portion 12 of solid-phase sheet growing substrate 100, it is divided into several pieces at several positions corresponding to the plurality of slit portions 21, which then fall into melt 506 as a plurality of detached portions.

The inside dimension of crucible 501 used in the embodiment of the present invention will then be described with reference to FIGS. 14 and 15.

Figure 14:
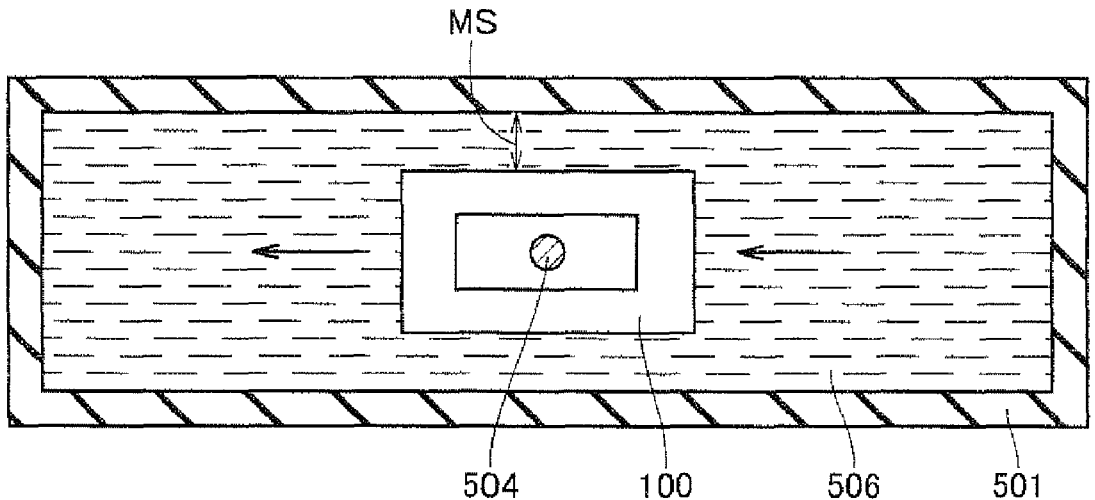
FIG. 14 is a top view schematically showing the path along which the solid-phase sheet growing substrate moves within the crucible in the embodiment of the present invention.

FIG. 14 is a top view schematically showing the path along which the solid-phase sheet growing substrate moves within the crucible in the embodiment of the present invention. Referring to FIG. 14, it is assumed that a distance MS between solid-phase sheet growing substrate 100 and the inner wall of crucible 501 at the time when solid-phase sheet growing substrate 100 moves in melt 506 is longer than spacing SS between slit grooves 20.

Figure 15:
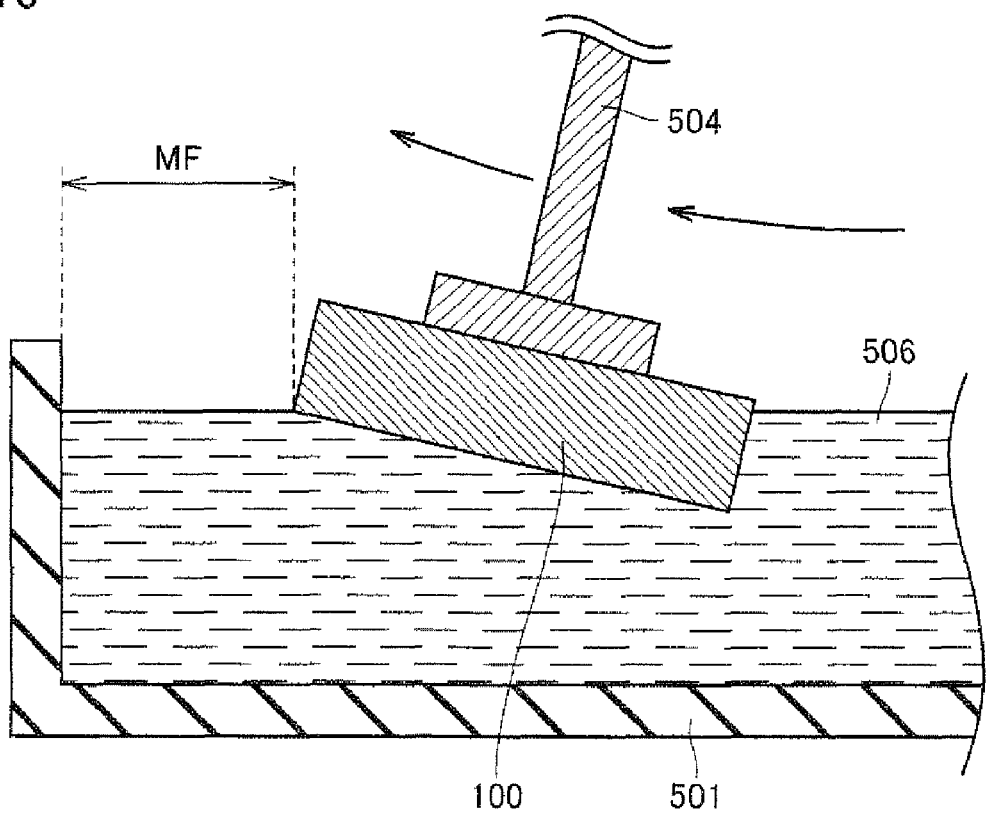
FIG. 15 is a cross-sectional view schematically showing the moment at which the solid-phase sheet growing substrate is moved out of the melt in the embodiment of the present invention.
Figure 16:
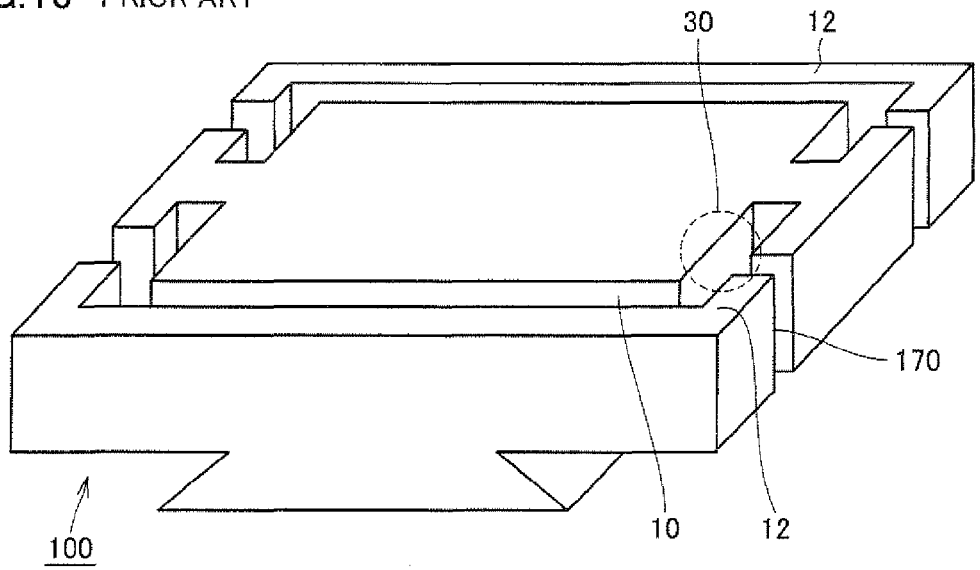
FIG. 16 is a perspective view schematically showing the configuration of the solid-phase sheet growing substrate disclosed in Japanese Patent Laying-Open No. 2002-237465.
Figure 17:
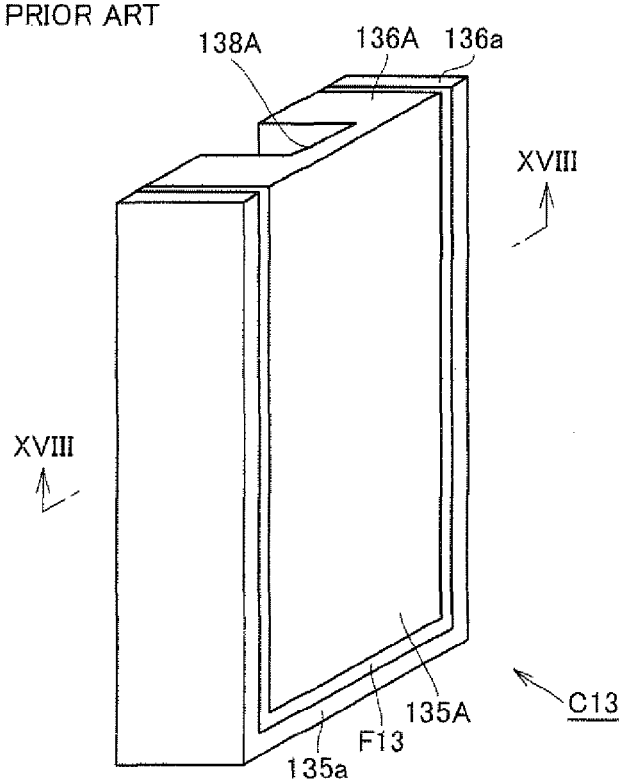
FIG. 17 is a perspective view schematically showing a plate-like silicon forming substrate disclosed in the pamphlet of International Publication No. 04/016836.
Figure 18:
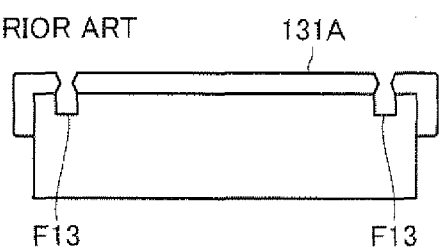
FIG. 18 is a schematic cross-sectional view taken along the line XVIII-XVIII in FIG. 17.

FIG. 15 is a cross-sectional view schematically showing the moment at which, the solid-phase sheet growing substrate is moved out of the melt in the embodiment of the present invention. Referring to FIG. 15, it is assumed that a distance MF between solid-phase sheet growing substrate 100 and the inner wall of crucible 501 at the time when solid-phase sheet growing substrate 100 is moved out of melt 506 is longer than spacing SS between slit grooves 20.

According to the present embodiment, as shown in FIGS. 1 and 6, slit groove 20 is formed on side surface 2A of surrounding portion 12 of solid-phase sheet growing substrate 100. Consequently, as shown in FIG. 13, slit portion 21 is formed in detached portion 201 of solid-phase sheet 200 in the manufacturing process. The operation and effect of this slit portion 21 will be hereinafter described.

First, if slit portion 21 is formed in detached portion 201, melt 506 enters through slit portion 21 of detached portion 201 which has fallen into melt 506. This causes an increase in the area in which melt 506 and detached portion 201 are in contact with each other, with the result that detached portion 201 re-melts for a short period of time. Accordingly, the time required for re-melting is shortened and the production efficiency is improved.

Furthermore, when detached portion 201 having an L-shaped cross-section falls into melt 506 with the L-shaped corner portion side up, it contains in this corner portion the atmosphere within a chamber 502, with the result that melt 506 may give buoyancy to the atmosphere contained therein. In the present embodiment, since this contained atmosphere can be released through slit portion 21 described above, the buoyancy is reduced. Therefore, if detached portion 201 has a specific gravity greater than that of melt 506, it is ensured that detached portion 201 sinks in melt 506 and re-melts for a short period of time. Furthermore, also in the case where detached portion 201 has a specific gravity less than that of melt 506, if the buoyancy is reduced, the area of detached portion 201 immersed in melt 506 is increased to thereby achieve re-melting for a short period of time. Accordingly, the time required for re-melting is shortened and the production efficiency is improved.

Furthermore, detached portion 201 re-melts preferentially from slit portion 21, which is completed for a period of time shorter than that during which detached portion 201 melts completely. At this point of time, detached portion 201 is broken into fragments each having a length approximately corresponding to spacing SS between slit grooves 20 in solid-phase sheet growing substrate 100. This fragmentation causes acceleration of re-melting. In addition, this fragmentation can prevent the event from occurring in which detached portion 201 is sandwiched between solid-phase sheet growing substrate 100 and crucible 501.

According to the present embodiment, as shown in FIGS. 1 and 6, slit groove 20 and peripheral groove 10A are formed separated from each other. If slit groove 20 and peripheral groove 10A are integrated with each other, the surface tension of melt 506 is insufficient in the joined portion thereof; and thus, melt 506 enters into slit groove 20 and peripheral groove 10A. Instead, if slit groove 20 and peripheral groove 10A are separated from each other, melt 506 can be prevented from entering.

According to the present embodiment, preferably, as shown in FIG. 5, solid-phase sheet growing substrate 100 is assumed to be in a state in which slit groove 20 has a portion immersed in melt 506 and a portion not immersed in melt 506. Accordingly, it is ensured that slit portion 21 having one end opened as shown in FIG. 13 is formed.

According to the present embodiment, preferably, slit groove 20 has width SW of not less than 1 mm and not more than 5 mm. This allows slit portion 21 to be formed in detached portion 201 with reliability in the case where solid-phase sheet growing substrate 100 is used for manufacturing a solid-phase sheet of a semiconductor.

According to solid-phase sheet growing substrate 100 of the present embodiment, preferably, slit groove 20 has depth SD of not less than 1 mm. This allows slit portion 21 to be formed in detached portion 201 with reliability in the case where solid-phase sheet growing substrate 100 is used for manufacturing a solid-phase sheet of a semiconductor.

According to the present embodiment, preferably, there are a plurality of slit grooves 20 in which a spacing between adjacent slit grooves 20 described above is not less than 1 mm. Accordingly, solid-phase sheet growing substrate 100 can be prevented from being broken in the case where solid-phase sheet growing substrate 100 is used for manufacturing a solid-phase sheet of a semiconductor.

According to the present embodiment, preferably, when solid-phase sheet growing substrate 100 is immersed in melt 506 in crucible 501, distances MS and MF between solid-phase sheet growing substrate 100 and crucible 501 shown in FIGS. 14 and 15, respectively, each are assumed to be longer than spacing SS between slit grooves 20 of solid-phase sheet growing substrate 100. This prevents the object having dimensions less than or equal to spacing SS between slit grooves 20 from being sandwiched between solid-phase sheet growing substrate 100 and crucible 501. In the present embodiment, detached portion 201 that has fallen into melt 506 is broken into fragments each having a length less than or equal to spacing SS between slit grooves 20 at an early stage due to the effects of slit portion 21. Accordingly, detached portion 201 can be prevented from being sandwiched between solid-phase sheet growing substrate 100 and crucible 501 to cause breakage of a manufacturing apparatus.

According to the present embodiment, a solid-phase sheet is preferably a semiconductor. This allows a polycrystalline silicon sheet to be manufactured which is used for a solar cell and the like. Furthermore, since melt 506 is used as a melt 506 of a semiconductor material, when slit groove 20 has width SW of not less than 1 mm and not more than 5 mm and depth SD of not less than 1 mm, the most suitable surface tension is applied to melt 506 to ensure that slit portion 21 is formed in detached portion 201.

Examples

Specific examples will be hereinafter described in which a semiconductor solid-phase sheet used for a solar cell is manufactured using a solid-phase sheet growing substrate and a method of manufacturing a solid-phase sheet using the same.

Referring to FIG. 1, a solid-phase sheet growing substrate 100 made of graphite was prepared. Solid-phase sheet growing substrate 100 had a general outer shape in the form of a square plate. This plate-shaped square had a side length W1 of 150 mm and a thickness H of 20 mm. Furthermore, a length W2 of the region between opposing peripheral grooves 10A in an inner portion 11 was 132 mm. A slit groove 20 formed on a side surface 2A had a width SW of 3 mm, a depth SD of 2 mm and a length SL of 15 mm, and a spacing SS between slit grooves 20 was 12 mm. Peripheral grooves 10A and 10B each had a width EW of 3 mm and a depth ED of 2 mm.

Referring to FIG. 2, the boron concentration of a silicon material was adjusted such that a solid-phase sheet 200 to be obtained might have a specific resistance of 2Ω·cm. This silicon material was introduced into a crucible 501 made of high purity graphite. Crucible 501 was disposed in an apparatus main chamber 511 of a chamber 502.

After chamber 502 was vacuumized, an Ar gas was introduced as an atmosphere. Chamber 502 was assumed to be in the steady state in which the pressure was set to 800 hPa while the Ar gas was continuously supplied from the top of chamber 502 at 100 L/min.

The setting temperature of a controlling thermocouple of a silicon melting heater 503 located around crucible 501 was then set to 1500° C. This caused the silicon material to be in a completely melted state. As the introduced silicon material melted to cause a reduction in bulk, additional silicon material was introduced to attain a prescribed height of the level of a silicon melt 506. The setting temperature was then changed to 1430° C. and held for 30 minutes for stabilizing the temperature of melt 506.

Solid-phase sheet growing substrate 100 was attached to the tip of an immersion mechanism 504. Solid-phase sheet growing substrate 100 was then immersed in silicon melt 506 to a depth of about 10 mm. This caused solid-phase sheet 200 to grow on the surface of solid-phase sheet growing substrate 100.

Solid-phase sheet growing substrate 100 was then transported to an apparatus sub-chamber 509 by a substrate transporting conveyor 508. Then, a gate valve 510 separating apparatus sub-chamber 509 and apparatus main chamber 511 was closed and apparatus sub-chamber 509 was vacuumized by a rotary pump to be exchanged with the atmospheric air. Solid-phase sheet growing substrate 100 having solid-phase sheet 200 formed thereon was then removed out of apparatus sub-chamber 509.

Solid-phase sheet 200 formed on solid-phase sheet growing substrate 100 could be easily peeled off. Solid-phase sheet 200 having an area of 132×132 mm obtained from the region of inner portion 11 was cut into a portion having an area of 126×126 mm using a laser cutting apparatus.

A solar cell was then manufactured using solid-phase sheet 200 having an area of 126×126 mm obtained by this laser cutting. Solid-phase sheet 200 described above was etched by the mixed solution of nitric acid and hydrofluoric acid, and then subjected to alkali etching using sodium hydroxide solution. An n-layer was subsequently formed on a p-type substrate by POCl3 diffusion. After a PSG film formed on the surface of silicon solid-phase sheet 200 was removed by hydrofluoric acid, a plasma CVD (Chemical Vapor Deposition) method was used to form a silicon nitride film on the n-layer which was to be a light-receiving surface of the solar cell. The n-layer formed on the surface which was to be a rear surface of the solar cell was removed by etching using the mixed solution of nitric acid and hydrofluoric acid. Thus, the p-type substrate was exposed, on which an Al paste was printed using a screen printing method and then subjected to firing, to thereby form a backside electrode and a p+ layer simultaneously. Then, a solder coating was applied to obtain a solar cell.

The cell characteristics of 100 pieces of solar cells manufactured in this way were measured under irradiation of AM1.5 (100 mW/cm2) and excellent results were obtained. Specifically, the average open-circuit voltage was 580 mV, the average short-circuit current was 30.8 mA/cm2, the average fill factor was 0.736, and the average conversion efficiency was 13.1%.

It should be understood that the embodiments disclosed herein are illustrative and non-restrictive in every respect. The scope of the present invention is defined by the terms of the claims, rather than the description above, and is intended to include any modifications within the scope and meaning equivalent to the terms of the claims.

INDUSTRIAL APPLICABILITY

The present invention may be particularly advantageously applied to a solid-phase sheet growing substrate for growing a material made of a melt on the surface thereof and a method of manufacturing a solid-phase sheet using the solid-phase sheet growing substrate.

The invention claimed is:

1. A solid-phase sheet growing substrate comprising a main surface and a side surface surrounding said main surface, said main surface being divided by a peripheral groove into a surrounding portion located at an outer side of said peripheral groove and an inner portion located at an inner side of said peripheral groove a plurality of slit grooves separated from said peripheral groove being formed on said side surface of said surrounding portion and said side surface located between the slit grooves adjacent to each other among the plurality of said slit grooves being a flat surface.

2. The solid-phase sheet growing substrate according to claim 1, wherein said peripheral groove is provided such that a solid-phase sheet formed on said surrounding portion and a solid-phase sheet formed on said inner portion are formed separately along said peripheral groove.

3. The solid-phase sheet growing substrate according to claim 1, wherein said slit grooves each have a width of not less than 1 mm and not more than 5 mm.

4. The solid-phase sheet growing substrate according to claim 1, wherein said slit grooves each have a depth of not less than 1 mm.

5. The solid-phase sheet growing substrate according to claim 1, comprising a plurality of said slit grooves, wherein a spacing between adjacent said slit grooves is not less than 1 mm.

6. A method of manufacturing a solid-phase sheet, immersing said solid-phase sheet growing substrate according to claim 1 in a melt to grow a solid-phase sheet on said main surface of said solid-phase sheet growing substrate using said melt as a material.

7. The method of manufacturing the solid-phase sheet according to claim 6, wherein when said solid-phase sheet growing substrate is immersed in said melt, a portion of each of said slit grooves is immersed and a portion of each of said slit grooves is not immersed.

8. The method of manufacturing the solid-phase sheet according to claim 6, wherein said solid-phase sheet growing substrate comprises a plurality of said slit grooves, a crucible contains said melt, and said solid-phase sheet growing substrate is immersed at a distance from an inner wall of said crucible longer than a spacing between said slit grooves.

9. The method of manufacturing the solid-phase sheet according to claim 6, wherein said solid-phase sheet is a semiconductor.

* * * * *